(12) United States Patent
Mizoguchi

(10) Patent No.: US 10,270,419 B2
(45) Date of Patent: Apr. 23, 2019

(54) DIPLEXER

(71) Applicant: Murata Manufacturing Co., Ltd., Nagaokakyo-shi, Kyoto-fu (JP)

(72) Inventor: Naoki Mizoguchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/985,745

(22) Filed: May 22, 2018

(65) Prior Publication Data
US 2018/0269846 A1 Sep. 20, 2018

Related U.S. Application Data

(63) Continuation of application No. PCT/JP2017/003361, filed on Jan. 31, 2017.

(30) Foreign Application Priority Data

Feb. 10, 2016 (JP) .................. 2016-023583

(51) Int. Cl.
*H03H 1/00* (2006.01)
*H03H 7/01* (2006.01)
*H03H 7/46* (2006.01)

(52) U.S. Cl.
CPC .......... *H03H 7/463* (2013.01); *H03H 7/0115* (2013.01); *H03H 7/0138* (2013.01);
(Continued)

(58) Field of Classification Search
CPC .... H03H 7/463; H03H 7/0138; H03H 7/0161; H03H 7/0115; H03H 7/175;
(Continued)

(56) References Cited

U.S. PATENT DOCUMENTS 6,411,178 B1   6/2002  Matsumura et al.
2006/0117163 A1   6/2006  Okuyama et al.
(Continued)

FOREIGN PATENT DOCUMENTS

JP   2001-136045 A   5/2001
JP   2006-140862 A   6/2006
(Continued)

OTHER PUBLICATIONS

Official Communication issued in International Patent Application No. PCT/JP2017/003361, dated Apr. 25, 2017.

*Primary Examiner* — Robert J Pascal
*Assistant Examiner* — Kimberly E Glenn
(74) *Attorney, Agent, or Firm* — Keating & Bennett, LLP

(57) ABSTRACT

A diplexer includes a multilayer substrate, first, second, and third terminals, and a ground terminal provided on the multilayer substrate. The first filter is between the first terminal and the second terminal, the second filter is between the first terminal and the third terminal. An interlayer spacing of the multilayer substrate includes a first filter ground electrode, a second filter ground electrode, and a shield ground electrode shielding between the first filter and the second filter. The ground terminal includes a first filter ground terminal connected to the first filter ground electrode, a second filter ground terminal connected to the second filter ground electrode, and a shield ground terminal connected to the shield ground electrode.

17 Claims, 12 Drawing Sheets

(52) U.S. Cl.
CPC .......... *H03H 7/0161* (2013.01); *H03H 7/175* (2013.01); *H03H 7/1758* (2013.01); *H03H 7/1766* (2013.01); *H03H 7/1775* (2013.01); *H03H 2001/0085* (2013.01)

(58) Field of Classification Search
CPC .. H03H 7/1758; H03H 7/1766; H03H 7/1775; H03H 2001/0085
USPC ........................................................ 333/132
See application file for complete search history.

(56) References Cited

U.S. PATENT DOCUMENTS

| | | |
|---|---|---|
| 2012/0182087 A1 | 7/2012 | Ye et al. |
| 2014/0091877 A1 | 4/2014 | Uejima |
| 2014/0232481 A1 | 8/2014 | Mizoguchi |
| 2016/0142041 A1* | 5/2016 | Kuwahara .............. H03H 9/725 333/195 |

FOREIGN PATENT DOCUMENTS

| | | |
|---|---|---|
| JP | 2006-262349 A | 9/2006 |
| JP | 2010-154138 A | 7/2010 |
| JP | 2014-179967 A | 9/2014 |
| JP | 2015-070489 A | 4/2015 |
| WO | 2013/002089 A1 | 1/2013 |

\* cited by examiner

ILLUSTRATION OF FOLLOWING
BASE LAYERS BL IS OMITTED

BASE LAYERS STACKED ON MULTILAYER SUBSTRATE OF DIPLEXER 1100

101a (SEVENTH BASE LAYER FROM THE TOP STACKED THEREON)

RECEPTION FILTER   TRANSMISSION FILTER 101b (EIGHTH BASE LAYER FROM THE TOP STACKED THEREON)

RECEPTION FILTER   TRANSMISSION FILTER 101c (18TH BASE LAYER FROM THE TOP STACKED THEREON)

SAMPLE 1: LENGTH FROM COMMON GROUND ELECTRODE TO EACH GROUND TERMINAL IS SHORT
SAMPLE 2: LENGTH FROM COMMON GROUND ELECTRODE TO EACH GROUND TERMINAL IS LONG

DIPLEXER

CROSS REFERENCE TO RELATED APPLICATIONS

This application claims the benefit of priority to Japanese Patent Application No. 2016-023583 filed on Feb. 10, 2016 and is a Continuation Application of PCT Application No. PCT/JP2017/003361 filed on Jan. 31, 2017. The entire contents of each application are hereby incorporated herein by reference.

BACKGROUND OF THE INVENTION

1. Field of the Invention

The present invention relates to a diplexer including a first filter and a second filter and, more specifically, to a diplexer having excellent frequency characteristics, in which a first filter and a second filter are sufficiently isolated.

2. Description of the Related Art

In wireless communication, in order to use a single antenna for both transmission and reception, a diplexer is used in some cases.

Further, in high-speed data communication using a cable television line, a single cable line is used for both transmission and reception, a diplexer is used in some cases. As a standard for high-speed data communication using the cable television line, for example, there is a data communication service based on Data Over Cable Service Interface Specifications (DOCSIS (Registered Trademark)).

A diplexer available for such use is disclosed in Japanese Unexamined Patent Application Publication No. 2014-179967.

The diplexer disclosed in Japanese Unexamined Patent Application Publication No. 2014-179967 includes a multilayer substrate (stacked body) in which a plurality of base layers are stacked. In interlayer spacings of the multilayer substrate, capacitor electrodes, line electrodes (pattern conductors), ground electrodes (ground conductors), and wiring electrodes are stacked. Further, via conductors that establish electrical connections are formed in such a manner as to penetrate through both principal surfaces of the base layer. Further, inductors are mounted on a non-mounting surface (upper-side principal surface) of the multilayer substrate.

In the diplexer disclosed in Japanese Unexamined Patent Application Publication No. 2014-179967, the capacitors are formed from the capacitor electrodes or from the capacitor electrodes and the ground electrodes. Further, the inductors are formed from the line electrodes. These capacitors and inductors and the inductors mounted on the non-mounting surface of the multilayer substrate are used to form a low-pass filter and a high-pass filter.

However, in the diplexer disclosed in Japanese Unexamined Patent Application Publication No. 2014-179967, no isolation mechanism is provided between the low-pass filter and the high-pass filter even though the low-pass filter and the high-pass filter are formed next to each other within the multilayer substrate. This allows a reception signal that passes through the high-pass filter to enter the low-pass filter or a transmission signal that passes through the low-pass filter to enter the high-pass filter due to inter-line capacitance or electromagnetic coupling between an internal electrode pattern of the low-pass filter and an internal electrode pattern of the high-pass filter, thus causing an issue of frequency characteristics degradation.

Although the diplexer disclosed in Japanese Unexamined Patent Application Publication No. 2014-179967 is a diplexer including a low-pass filter and a high-pass filter, a diplexer including a low-pass filter and a bandpass filter has the same issue.

In order to resolve the foregoing problem, in a diplexer (high frequency module) disclosed in Japanese Unexamined Patent Application Publication No. 2006-140862, a shield ground electrode (ground conductor layer) is formed within a multilayer substrate (stacked substrate) between filters to improve the isolation between the filters. The diplexer disclosed in Japanese Unexamined Patent Application Publication No. 2006-140862 is a complex diplexer including a plurality of low-pass filters and a plurality of bandpass filters as well as a plurality of transmission signal channels and a plurality of reception signal channels and being used by switching a necessary filter with a switch.

FIGS. 11A to 11C illustrate a diplexer 1100 disclosed in Japanese Unexamined Patent Application Publication No. 2006-140862. Note that FIGS. 11A to 11C respectively illustrate upper-side principal surfaces of three base layers 101a, 101b, and 101c, which are extracted for explanation, out of nineteen base layers (dielectric layers) of a multilayer substrate (not illustrated) of the diplexer 1100. FIG. 11A illustrates the base layer 101a which is the seventh stacked layer from the top. FIG. 11B illustrates the base layer 101b which is the eighth stacked layer from the top. FIG. 11C illustrates the base layer 101c which is the eighteenth stacked layer from the top.

The diplexer 1100 is formed so that a reception filter is formed at a left-half region and a transmission filter is formed at a right-half region of FIGS. 11A and 11B.

In a plurality of interlayer spacings of the multilayer substrate of the diplexer 1100, a shield ground electrode (ground conductor layer) 102 illustrated in FIG. 11A is formed. The shield ground electrodes 102 formed in different interlayer spacings are connected to each other by via conductors (through holes) 103 illustrated in FIGS. 11A and 11B. In the diplexer 1100, the isolation between the reception filter and the transmission filter is achieved by the shield ground electrode 102 and the via conductors 103.

In the diplexer 1100, a ground of the reception filter, a ground of the transmission filter, and the shield ground electrode 102 are first brought together and connected to a single ground electrode (conductor layer) 104 formed on the eighteenth base layer 101c illustrated in FIG. 11C, and then the ground electrode 104 is connected to six ground terminals G1 to G6.

In the diplexer 1100, all of the grounds are first brought together to the single ground electrode 104, and then the ground electrode 104 is connected to the six ground terminals G1 to G6 and to a ground of a system (a communication equipment into which the diplexer 1100 is integrated). Therefore, an actual characteristic of the diplexer 1100 viewed from the system side appears as a characteristic in which a small inductance component L and a stray capacitance are added between the internal ground electrode 104 and the ground of the system. This causes the grounds to be connected to a common internal ground electrode, thus causing a problem in that the isolation between the filters has a limited effect. Further, there is also an issue in that, since the grounds of respective filters share the common ground, the inductance component and the stray capacitance formed between the filter and the system cannot be adjusted separately, thus making it difficult to fully utilize characteristics of each filter.

An experiment was conducted to study the influence on the frequency characteristics by the magnitude of an inductance component formed between a filter and a ground terminal. Specifically, diplexers according to a sample 1 and a sample 2 were prepared. These diplexers are different in length between a ground electrode of the filter and the ground terminal, and different in magnitude of the inductance component formed in that part. Further, frequency characteristics of the sample 1 and the sample 2 were compared.

Each of the diplexers according to the sample 1 and the sample 2 includes a multilayer substrate within which capacitor electrodes and ground electrodes are stacked, and a plurality of inductors are mounted on an upper-side principal surface of the multilayer substrate. Further, on a lower-side principal surface of the multilayer substrate, a first terminal, a second terminal, a third terminal, and a ground terminal are formed. Capacitors formed from the capacitor electrodes inside the multilayer substrate and the inductors mounted form a low-pass filter between the first terminal and the second terminal and a high-pass filter between the first terminal and the third terminal. A ground of the low-pass filter and a ground of the high-pass filter are first brought together to a common ground electrode inside the multilayer substrate, and then this common ground electrode is connected to each of the ground terminals formed on the surface of the multilayer substrate.

The length of a line path from the common ground electrode to the ground terminal in the diplexer of the sample 2 is made longer than the length of a line path from the common ground electrode to the ground terminal in the diplexer of the sample 1. Accordingly, an inductance component formed between the common ground electrode and the ground terminal in the diplexer of the sample 2 is greater than an inductance component formed between the common ground electrode and the ground terminal in the diplexer of the sample 1.

FIG. 12 illustrates frequency characteristics of diplexers of the sample 1 and the sample 2. Dotted lines represent the frequency characteristics of the diplexer of the sample 1, and solid lines represent the frequency characteristics of the diplexer of the sample 2. It is preferable to have, as in the diplexer of the sample 2, a longer length of the line path from the common ground electrode to the ground terminal to make the inductance component larger because, in the low-pass filter, attenuation in a high frequency side is greater than attenuation in its passband, as indicated by a dotted line ellipse V-1. However, in the high-pass filter, it is not preferable because attenuation in low frequency side near its passband becomes smaller, as indicated by a dotted line ellipse V-2.

As is clear from this experiment, it is preferable to be able to adjust the inductance component formed between the low-pass filter and the ground terminal and the inductance component formed between the high-pass filter and the ground terminal separately.

Whereas, the diplexer 1100 disclosed in Japanese Unexamined Patent Application Publication No. 2006-140862 cannot adjust the inductance component formed between the filter and the ground terminal for each of the filters because all of the grounds are first brought together to the ground electrode 104, and then the ground electrode 104 is connected to the ground terminals G1 to G6. Further, the stray capacitance formed between the filter and the ground terminal cannot be adjusted.

SUMMARY OF THE INVENTION

Preferred embodiments of the present invention provide diplexers having excellent frequency characteristics, in which a first filter and a second filter are sufficiently isolated.

A diplexer according to a preferred embodiment of the present invention includes a multilayer substrate including a mounting surface and a non-mounting surface, and a plurality of base layers that are stacked; and a first terminal, a second terminal, a third terminal, and a ground terminal provided on the mounting surface of the multilayer substrate, wherein a first filter is provided between the first terminal and the second terminal, and a second filter is provided between the first terminal and the third terminal, the multilayer substrate includes, in an interlayer spacing of the multilayer substrate, a first filter ground electrode, a second filter ground electrode, and a shield ground electrode that provides shielding between the first filter and the second filter, wherein the first filter ground electrode, the second filter ground electrode, and the shield ground electrode are independent from each other, and the ground terminal includes a first filter ground terminal connected to the first filter ground electrode, a second filter ground terminal connected to the second filter ground electrode, and a shield ground terminal connected to the shield ground electrode, wherein the first filter ground terminal, the second filter ground terminal, and the shield ground terminal are independent from each other.

The first filter may be, for example, a low-pass filter, and the second filter may be, for example, a high-pass filter or a bandpass filter.

Preferably, the first terminal is connected to each of the first filter and the second filter with a common inductor interposed therebetween, the common inductor being defined by a line electrode stacked in an interlayer spacing of the multilayer substrate. In this case, the common inductor further improves frequency characteristics of the first filter and further improves frequency characteristics of the second filter.

Preferably, the shield ground electrode provides shielding at least between an inductor on a second terminal side and an inductor on a third terminal side, the inductor on a second terminal side being one of a plurality of inductors included in the first filter and being disposed on a side of the second terminal among the inductors disposed between the first terminal and the second terminal, the inductor on a third terminal side being one of a plurality of inductors included in the second filter and being disposed on a side of the third terminal among the inductors disposed between the first terminal and the third terminal. It is known that a degrading influence on frequency characteristics is greater as coupling between the first filter and the second filter occurs at a latter portion thereof. The above-described configuration reduces or prevents the coupling of the first filter and the second filter at a latter portion thereof, and in this case, degradation of the frequency characteristics is able to be effectively reduced or prevented. In a case in which the first terminal is connected to the common inductor, a wider spacing is able to be provided between the common inductor and the shield ground electrode, thus enabling reduction or prevention of the frequency characteristics degradation due to insufficient isolation between the common inductor and the shield ground electrode.

Preferably, the shield ground electrode is provided between the first filter ground electrode and the second filter ground electrode within the multilayer substrate. In this case, the isolation between the first filter and the second filter is further ensured.

Preferably, the first filter ground electrode and the first filter ground terminal are connected by a via conductor, and the second filter ground electrode and the second filter ground terminal are connected by a via conductor, and an inductance component between the first filter ground electrode and the first filter ground terminal via the via conductor is larger than an inductance component between the second filter ground electrode and the second filter ground terminal via the via conductor. In this case, the frequency characteristics are further improved in both of the first filter and the second filter.

Preferably, in this case, when an outer edge portion of the first filter ground electrode and an outer edge portion of the second filter ground electrode are compared, the outer edge portion of the second filter ground electrode has a larger number of indentations and/or has an indentation larger in size than the outer edge portion of the first filter ground electrode, and the number of the via conductors connecting the first filter ground electrode and the first filter ground terminal is less than the number of the via conductors connecting the second filter ground electrode and the second filter ground terminal. In this case, an inductance component between the first filter ground electrode and the first filter ground terminal via the via conductor is able to be easily made larger than an inductance component between the second filter ground electrode and the second filter ground terminal via the via conductor.

Preferably, the first filter ground electrode and the shield ground electrode are electromagnetically coupled, and the second filter ground electrode and the shield ground electrode are electromagnetically coupled. In this case, the electromagnetic coupling between the first filter ground electrode and the second filter ground electrode is able to be reduced or prevented, thus further ensuring the isolation between the first filter and the second filter.

Preferably, the shield ground electrode includes a plurality of shield ground electrodes, the plurality of shield ground electrodes are stacked in a plurality of interlayer spacings of the multilayer substrate, and the shield ground electrodes stacked in different interlayer spacings are connected to each other by via conductors. In this case, the first filter and the second filter are able to be isolated from each other by the plurality of shield ground electrodes and the via conductors that connect the plurality of shield ground electrodes, thus further ensuring the isolation between the first filter and the second filter.

A shield ground electrode may be further provided on the non-mounting surface of the multilayer substrate, and the shield ground electrode provided on the non-mounting surface of the multilayer substrate may be connected to the shield ground electrode stacked in an interlayer spacing of the multilayer substrate by a via conductor. In this case, the shield ground electrode provided on the non-mounting surface of the multilayer substrate may be used as a chuck mark during vacuum suction of a diplexer or a pin mark indicating a location of each terminal of the diplexer. In a case in which the chuck mark or the pin mark is a floating electrode, which is not connected to any other wiring, it is difficult to provide a protective layer on a surface by electrolytic plating. However, by structuring the chuck mark or the pin mark as a shield ground electrode and connecting the shield ground electrode to another shield ground electrode provided within the multilayer substrate, the protective layer may be easily provided on the surface of the chuck mark or the pin mark by electrolytic plating.

Preferably, the first filter ground electrode includes a plurality of first filter ground electrodes, the plurality of first filter ground electrodes are stacked in a plurality of interlayer spacings of the multilayer substrate, and the first filter ground electrodes stacked in different interlayer spacings are connected to each other by via conductors; the second filter ground electrode includes a plurality of second filter ground electrodes, the plurality of second filter ground electrodes are stacked in a plurality of interlayer spacings of the multilayer substrate, and the second filter ground electrodes stacked in different interlayer spacings are connected to each other by via conductor; the shield ground electrode includes a plurality of shield ground electrodes, the plurality of shield ground electrodes are stacked in a plurality of interlayer spacings of the multilayer substrate, and the shield ground electrodes stacked in different interlayer spacings are connected to each other by via conductor; and in a stacking direction of the multilayer substrate, an interlayer spacing where the multilayer substrate in which the first filter ground electrode, the second filter ground electrode, and the shield ground electrode are stacked in such a way that the shield ground electrode is interposed between the first filter ground electrode and the second filter ground electrode, and an interlayer spacing where the multilayer substrate in which the first filter ground electrode, the second filter ground electrode, and the shield ground electrode are not stacked, are repeatedly provided for a plurality of times in an alternating manner. In this case, by stacking a capacitor electrode in the interlayer spacing of the multilayer substrate in which none of the first filter ground electrode, the second filter ground electrode, and the shield ground electrode is stacked, it is possible to structure the capacitor electrode such that unwanted stray capacitance between this capacitor electrode and the ground electrode is unlikely to occur, and to reduce or prevent degradation of the frequency characteristics of the filter.

The multilayer substrate may be made of, for example, a low temperature co-fired ceramic. In this case, multilayer substrates to be used in diplexers of preferred embodiments of the present invention are able to be easily fabricated. However, the material of the multilayer substrate is not limited to the low temperature co-fired ceramic, and another type of ceramics, resin, and other suitable materials may alternatively be used.

In the diplexers according to preferred embodiments of the present invention, the first filter ground electrode, the second filter ground electrode, and the shield ground electrode are separately provided inside the multilayer substrate, the first filter ground terminal, the second filter ground terminal, and the shield ground terminal are separately provided on the mounting surface (or the mounting surface and a side surface) of the multilayer substrate, and each ground electrode and each ground terminal are connected separately. Accordingly, the isolation of the first filter and the second filter is ensured, and the frequency characteristics is excellent.

Further, in the diplexers according to preferred embodiments of the present invention, a stray capacitance and an inductance component between the first filter and the first filter ground terminal and a stray capacitance and an inductance component between the second filter and the second filter ground terminal are independently adjustable from one another. Accordingly, the frequency characteristics of the first filter are able to be improved or optimized without being influenced by another filter, and the frequency characteristics of the second filter are able to be improved or optimized without being influenced by another filter.

The above and other elements, features, steps, characteristics and advantages of the present invention will become more apparent from the following detailed description of the preferred embodiments with reference to the attached drawings.

BRIEF DESCRIPTION OF THE DRAWINGS

In FIGS. 8A and 8B, solid lines represent frequency characteristics of the diplexer 100, and dotted lines represent frequency characteristics of the diplexer according to a comparison example. Note that FIG. 8A is an enlarged view of part of FIG. 8B.

DETAILED DESCRIPTION OF THE PREFERRED EMBODIMENTS

Figure 1A:
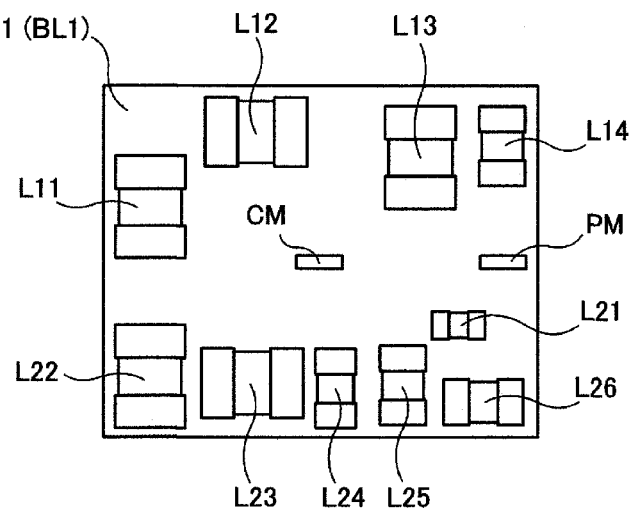
FIG. 1A is a top view of a diplexer 100 according to a first preferred embodiment of the present invention.

Hereinafter, preferred embodiments of the present invention are described with reference to the drawings.

Note that each preferred embodiment is provided for illustrative purposes only, and the present invention is not limited by contents of the preferred embodiment. Further, contents described in different preferred embodiments may be combined, and the contents in such case are also included in the present invention.

Further, the drawings are provided to assist in understanding the preferred embodiments and may not be precisely drawn in some case. For example, in some case, ratios of dimensions of elements that are drawn or ratios of dimensions between the elements may not agree with those described in the specification. Further, in some case, an element described in the specification may be omitted from the drawing, or may be drawn with abbreviation on the number of units thereof, for example.

First Preferred Embodiment

FIGS. 1A, 1B, and 1C and FIG. 2 to FIG. 7 show a diplexer 100 according to a first preferred embodiment of the present invention.

Figure 1B:
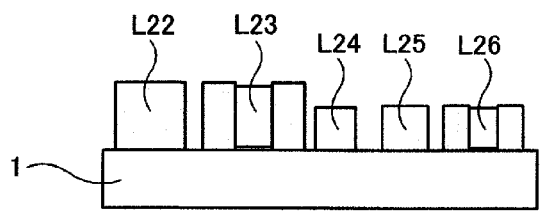
FIG. 1B is a front view of the diplexer 100.
Figure 1C:
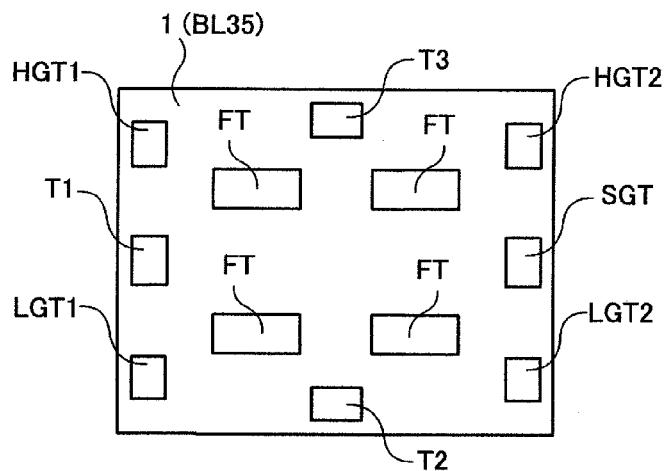
FIG. 1C is a bottom view of the diplexer 100.

Here, FIG. 1A is a top view of the diplexer 100. FIG. 1B is a front view of the diplexer 100. FIG. 1C is a bottom view of the diplexer 100.

Figure 2:
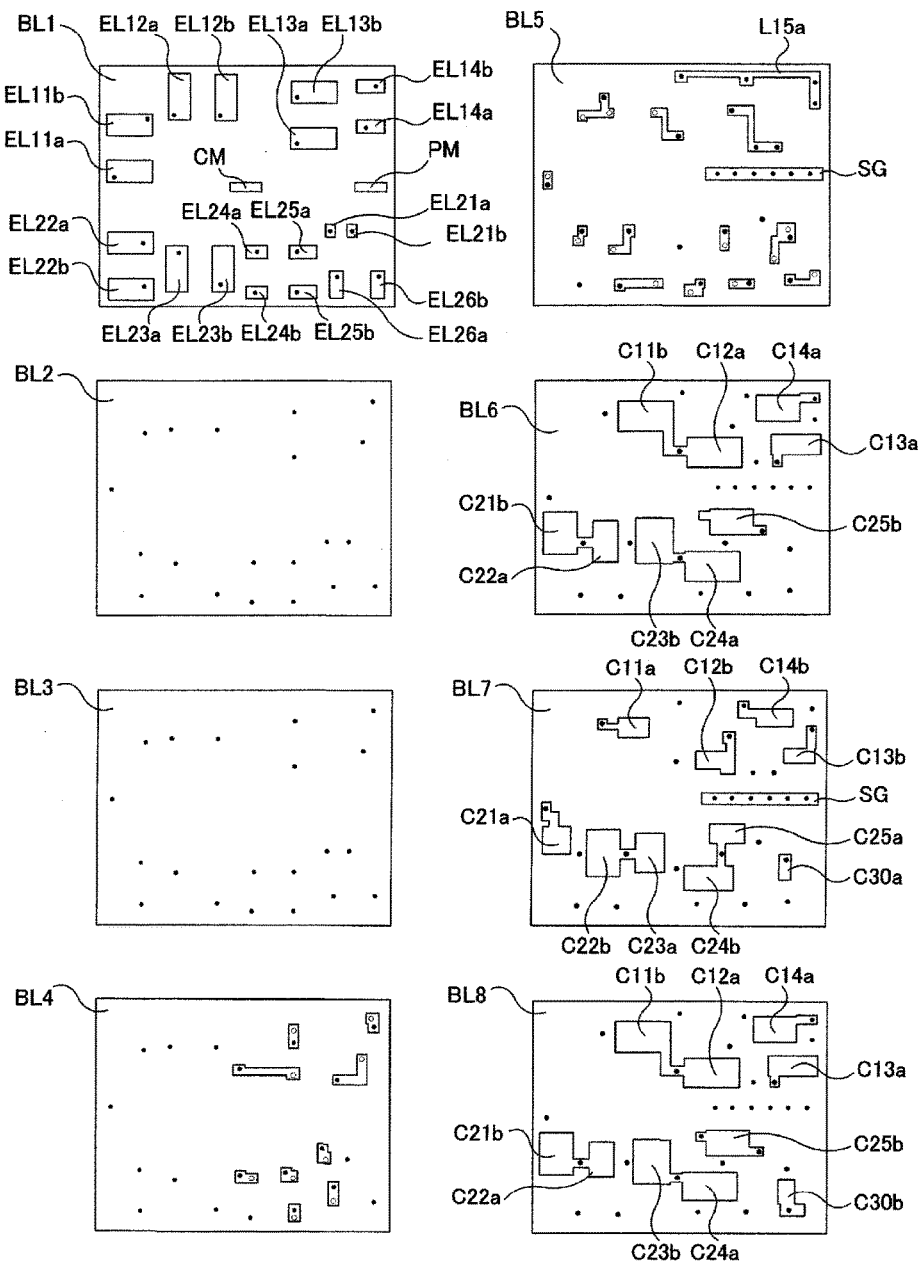
FIG. 2 shows plan views of respective upper-side principal surfaces of base layers BL1 to BL8 stacked on a multilayer substrate 1 of the diplexer 100.
Figure 3:
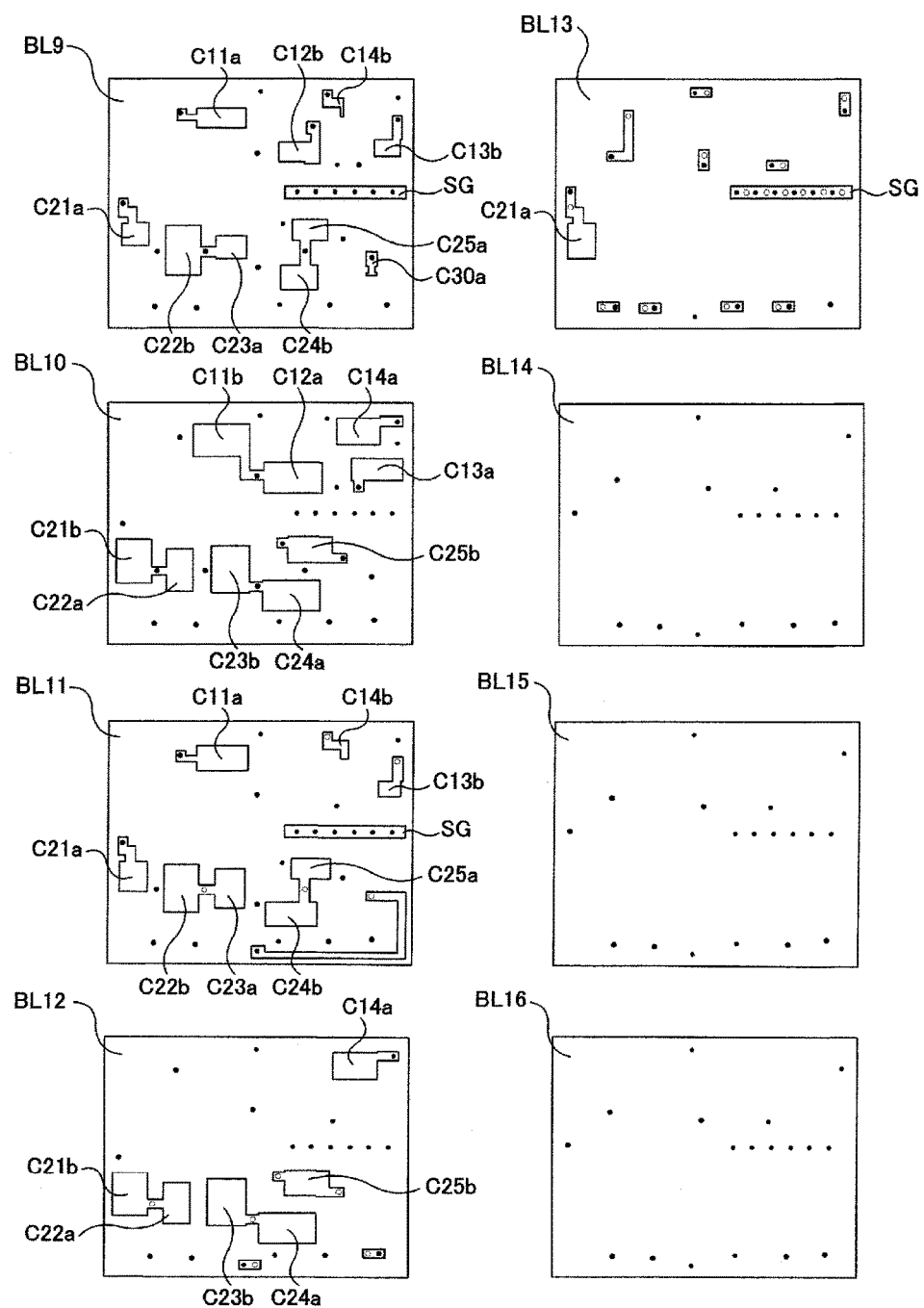
FIG. 3 shows plan views of respective upper-side principal surfaces of base layers BL9 to BL16 stacked on the multilayer substrate 1 of the diplexer 100.
Figure 4:
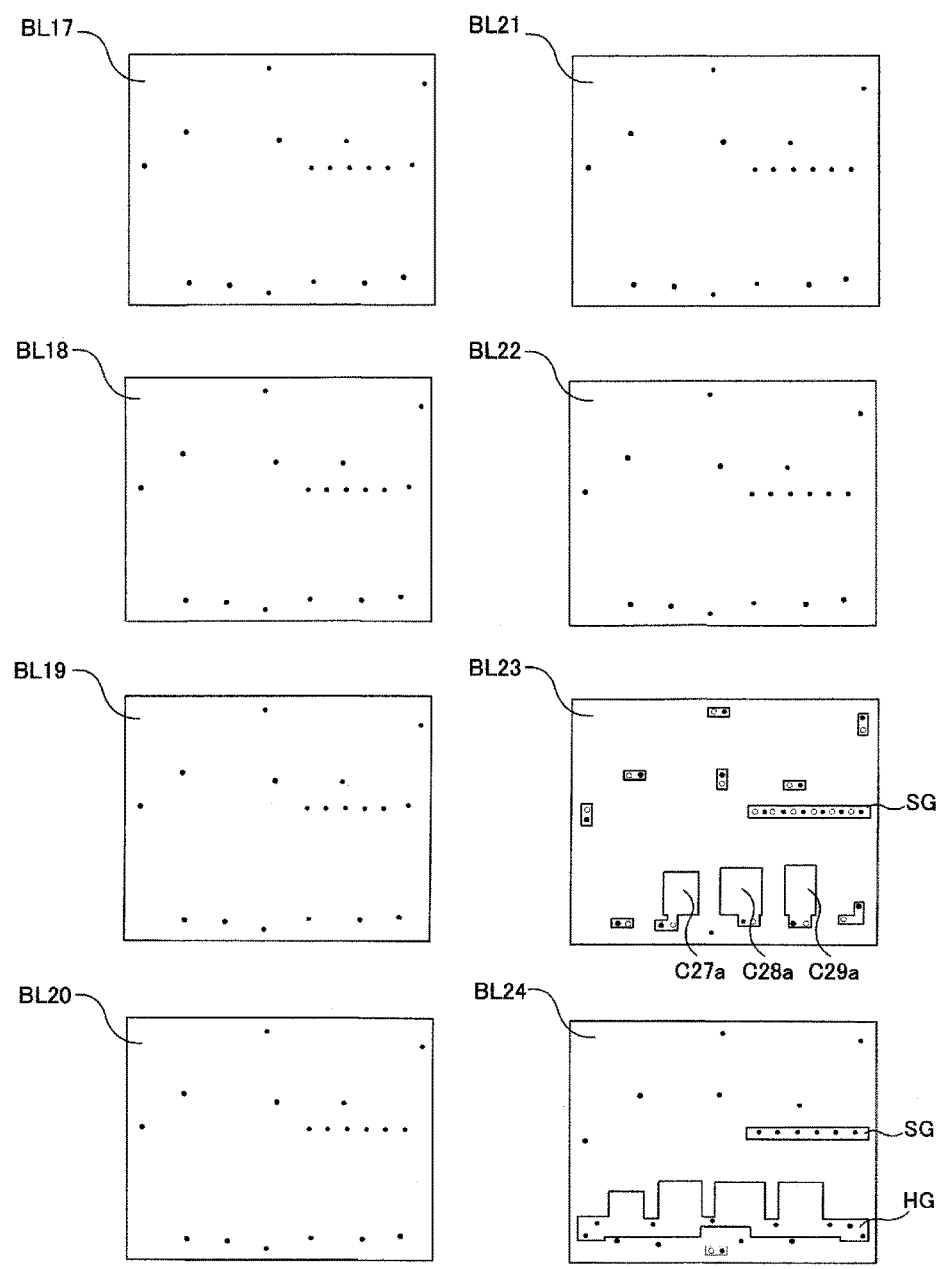
FIG. 4 shows plan views of respective upper-side principal surfaces of base layers BL17 to BL24 stacked on the multilayer substrate 1 of the diplexer 100.
Figure 5:
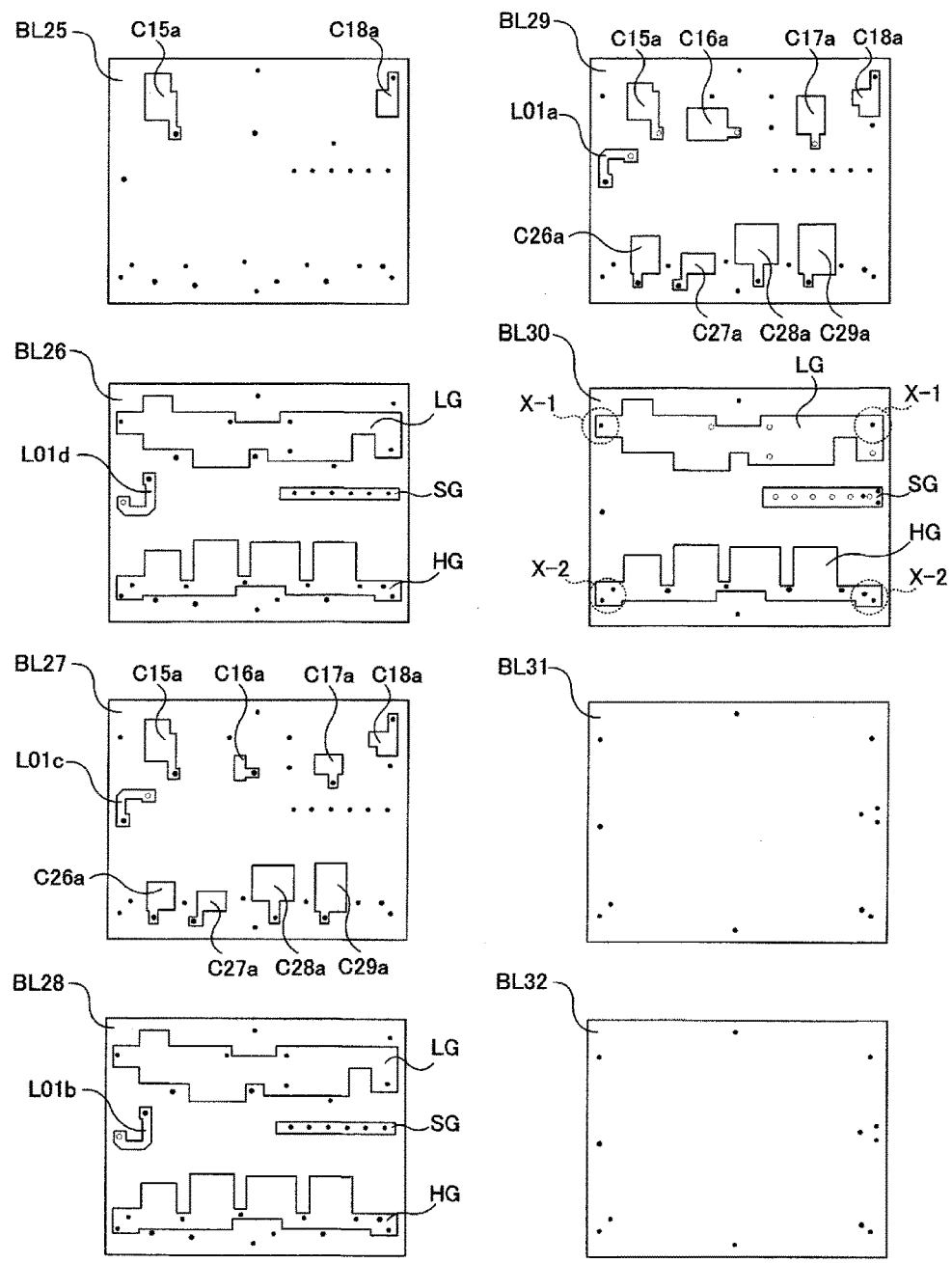
FIG. 5 shows plan views of respective upper-side principal surfaces of base layers BL25 to BL32 stacked on the multilayer substrate 1 of the diplexer 100.
Figure 6:
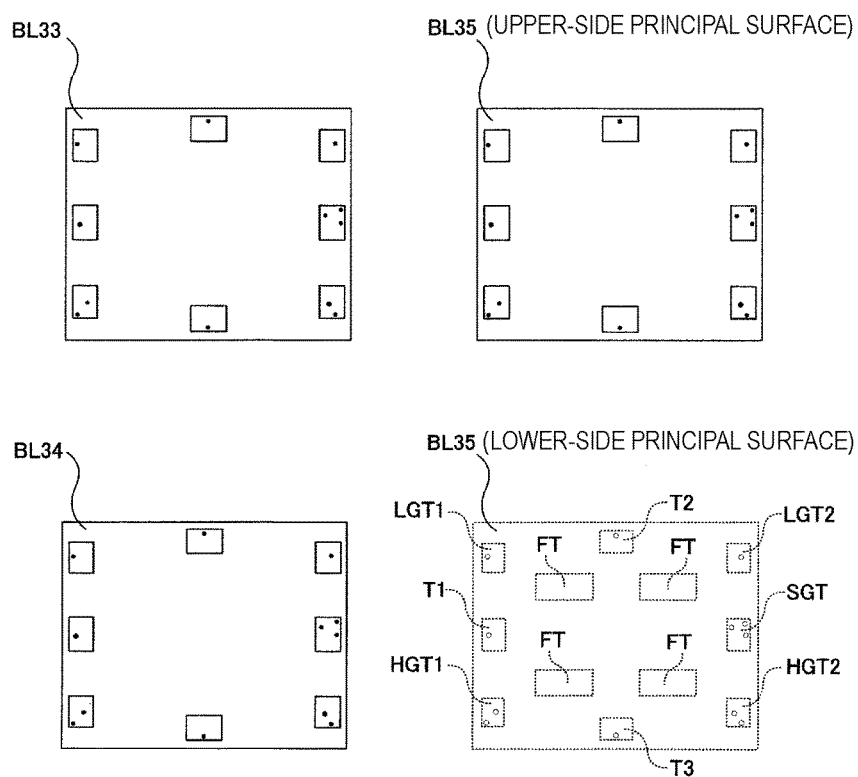
FIG. 6 shows plan views of respective upper-side principal surfaces of base layers BL33 to BL35 stacked on the multilayer substrate 1 of the diplexer 100. Further, with regard to the base layer BL35, a transparent view of a lower-side principal surface is illustrated.

FIG. 2 to FIG. 6 are stacking diagrams of 35 layers of base layers BL1 to BL35 included in a multilayer substrate 1 of the diplexer 100. FIG. 2 illustrates respective upper-side principal surfaces of the base layers BL1 to BL8. FIG. 3 illustrates respective upper-side principal surfaces of the base layers BL9 to BL16. FIG. 4 illustrates respective upper-side principal surfaces of the base layers BL17 to BL24. FIG. 5 illustrates respective upper-side principal surfaces of the base layers BL25 to BL32. FIG. 6 illustrates respective upper-side principal surfaces of the base layers BL33 to BL35. Further, with regard to the base layer BL35, a transparent view of a lower-side principal surface is additionally illustrated. On the lower-side principal surface of the base layer BL35, surface-mount terminals of the diplexer 100 are provided on a base substrate.

Figure 7:
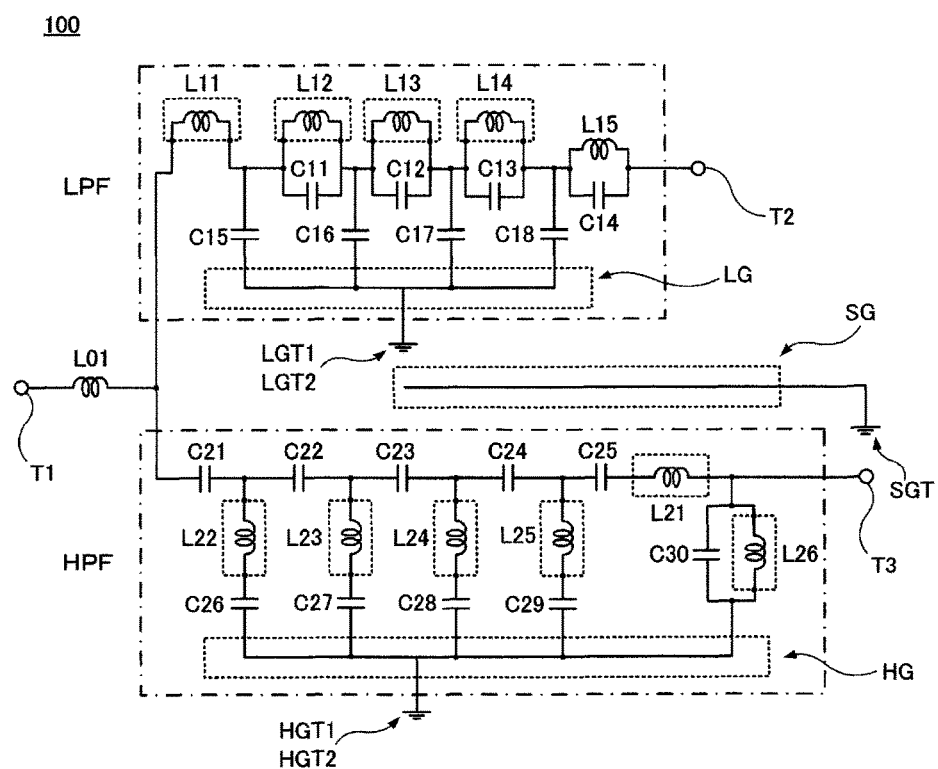
FIG. 7 is an equivalent circuit diagram of the diplexer 100.

FIG. 7 is an equivalent circuit diagram of the diplexer 100.

The diplexer 100 includes the multilayer substrate 1 as illustrated in FIGS. 1A to 1C.

In the present preferred embodiment, low temperature co-fired ceramics is preferably used as a material of the multilayer substrate 1. Use of low temperature co-fired ceramics enables formations of electrodes and terminals and firing of the multilayer substrate 1 at the same time, thus facilitating fabrication. However, the material of the multilayer substrate 1 is arbitrary, and another type of ceramics, resin, and other suitable materials may alternatively be used.

On the upper-side principal surface of the multilayer substrate 1, as illustrated in FIG. 1A, ten inductors L11 to L14 and L21 to L26 are mounted.

On the lower-side principal surface (bottom surface) of the multilayer substrate 1, as illustrated in FIG. 1C, a first terminal T1, a second terminal T2, and a third terminal T3 are provided. Further, on the lower-side principal surface of the multilayer substrate 1, two low-pass filter ground terminals LGT1 and LGT2 (first filter ground terminals), two high-pass filter ground terminals HGT1 and HGT2 (second filter ground terminals), and one shield ground terminal SGT are provided. Still further, at or near a center portion of the lower-side principal surface of the multilayer substrate 1, four floating terminals FT having no electrical connection are provided that enhance mounting strength.

In the diplexer 100, a low-pass filter LPF is disposed between the first terminal T1 and the second terminal T2 as a first filter, and a high-pass filter HPF is disposed between the first terminal T1 and the third terminal T3 as a second filter. The detail will be described later.

The multilayer substrate 1 is formed by sequentially stacking 35 base layers BL1 to BL35 from the top. As described above, FIG. 2 to FIG. 6 illustrate the upper-side principal surfaces of the respective base layers BL1 to BL35. However, in FIG. 2 to FIG. 6, in order to avoid complications, no reference characters are attached to via conductors, wiring electrodes, and relay electrodes.

The wiring electrode connects two points separated in a planar direction in an interlayer spacing of multilayer substrate 1. The relay electrode is provided in an interlayer spacing of the multilayer substrate 1 to ensure a connection between a via conductor provided on an upper base layer and a via conductor provided on a lower base layer.

As illustrated in FIG. 2, on (the upper-side principal surface of) the first (topmost layer) base layer BL1, ten pairs of land electrodes EL11a-EL14a, EL11b-EL14b, EL21a-EL26a, and EL21b-EL26b are provided to mount inductors. Further, on the base layer BL1, a chuck mark CM that defines and functions as a guide mark during vacuum suction of the diplexer 100 and pin marks PM indicating locations of the respective terminals of the diplexer 100 are provided. In the base layer BL1, a plurality of via conductors penetrate through both principal surfaces of the base layer BL1.

As illustrated in FIG. 1A, the inductor L11 is mounted on the land electrodes EL11a and EL11b. Similarly, the inductor L12 is mounted on the land electrodes EL12a and EL12b. The inductor L13 is mounted on the land electrodes EL13a and EL13b. The inductor L14 is mounted on the land electrodes EL14a and EL14b. The inductor L21 is mounted on the land electrodes EL21a and EL21b. The inductor L22 is mounted on the land electrodes EL22a and EL22b. The inductor L23 is mounted on the land electrodes EL23a and EL23b. The inductor L24 is mounted on the land electrodes EL24a and EL24b. The inductor L25 is mounted on the land electrodes EL25a and EL25b. The inductor L26 is mounted on the land electrodes EL26a and EL26b.

Returning to FIG. 2, in each of the second base layer BL2 and the third base layer BL3, a plurality of via conductors penetrate through both principal surfaces thereof.

On the fourth base layer BL4, a plurality of wiring electrodes are provided. Further, in the base layer BL4, a plurality of via conductors penetrate through both principal surfaces thereof.

On the fifth base layer BL5, a shield ground electrode SG is provided and shields the low-pass filter LPF from the high-pass filter HPF. Further, on the base layer BL5, a line electrode L15a (inductor L15) is provided. In addition, on the base layer BL5, a plurality of wiring electrodes are provided. Further, in the base layer BL5, a plurality of via conductors penetrate through both principal surfaces thereof.

On the sixth base layer BL6, nine capacitor electrodes C11b, C12a, C13a, C14a, C21b, C22a, C23b, C24a, and C25b are provided. Each pair of the capacitor electrodes C11b and C12a, the capacitor electrodes C21b and C22a, and the capacitor electrodes C23b and C24a are connected to each other by wiring electrodes. Further, in the base layer BL6, a plurality of via conductors penetrate through both principal surfaces thereof.

On the seventh base layer BL7, a shield ground electrode SG is provided. Further, on the base layer BL7, ten capacitor electrodes C11a, C12b, C13b, C14b, C21a, C22b, C23a, C24b, C25a, and C30a are provided. Each pair of the capacitor electrodes C22b and C23a and the capacitor electrodes C24b and C25a are connected to each other by wiring electrodes. Further, in the base layer BL7, a plurality of via conductors penetrate through both principal surfaces thereof.

On the eighth base layer BL8, ten capacitor electrodes C11b, C12a, C13a, C14a, C21b, C22a, C23b, C24a, C25b, an C30b are provided. Each pair of the capacitor electrodes C11b and C12a, the capacitor electrodes C21b and C22a, and the capacitor electrodes C23b and C24a are connected to each other by wiring electrodes. Further, in the base layer BL8, a plurality of via conductors penetrate through both principal surfaces thereof.

As illustrated in FIG. 3, on the ninth base layer BL9, a shield ground electrode SG is provided. Further, on the base layer BL9, ten capacitor electrodes C11a, C12b, C13b, C14b, C21a, C22b, C23a, C24b, C25a, and C30a are provided. Each pair of the capacitor electrodes C22b and C23a and the capacitor electrodes C24b and C25a are connected to each other by wiring electrodes. Further, in the base layer BL9, a plurality of via conductors penetrate through both principal surfaces thereof.

On the tenth base layer BL10, nine capacitor electrodes C11b, C12a, C13a, C14a, C21b, C22a, C23b, C24a, and C25b are provided. Each pair of the capacitor electrodes C11b and C12a, the capacitor electrodes C21b and C22a, and the capacitor electrodes C23b and C24a are connected to each other by wiring electrodes. Further, in the base layer BL10, a plurality of via conductors penetrate through both principal surfaces thereof.

On the eleventh base layer BL11, a shield ground electrode SG is provided. Further, on the base layer BL11, eight capacitor electrodes C11a, C13b, C14b, C21a, C22b, C23a, C24b, and C25a are provided. Each pair of the capacitor electrodes C22b and C23a and the capacitor electrodes C24b and C25a are connected to each other by wiring electrodes. Further, on the base layer BL11, a wiring electrode is provided. Further, in the base layer BL11, a plurality of via conductors penetrate through both principal surfaces thereof.

On the twelfth base layer BL12, six capacitor electrodes C14a, C21b, C22a, C23b, C24a, and C25b are provided. Each pair of the capacitor electrodes C21b and C22a and the capacitor electrodes C23b and C24a are connected to each other by wiring electrodes. Further, on the base layer BL12, a plurality of wiring electrodes is provided. Further, in the base layer BL12, a plurality of via conductors penetrate through both principal surfaces thereof.

On the thirteenth base layer BL13, a shield ground electrode SG is provided. Further, on the base layer BL13, a capacitor electrode C21a is provided. Further, on the base layer BL13, a plurality of wiring electrodes are provided. Further, in the base layer BL13, a plurality of via conductors penetrate through both principal surfaces thereof.

As illustrated in FIG. 3 and FIG. 4, in each of the fourteenth base layer BL14 to the 22nd base layer BL22, a plurality of via conductors penetrate through both principal surfaces thereof.

On the 23rd base layer BL23, a shield ground electrode SG is provided. Further, on the base layer BL23, three capacitor electrodes C27a, C28a, and C29a are provided. On the base layer BL23, a plurality of wiring electrodes is provided. Further, in the base layer BL23, a plurality of via conductors penetrate through both principal surfaces thereof.

On the 24th base layer BL24, a high-pass filter ground electrode HG (second filter ground electrode) and a shield ground electrode SG are provided. Further, on the base layer BL24, a wiring electrode is provided. Further, in the base layer BL24, a plurality of via conductors penetrate through both principal surfaces thereof.

As illustrated in FIG. 5, on the 25th base layer BL25, two capacitor electrodes C15a and C18a are provided. Further, in the base layer BL25, a plurality of via conductors penetrate through both principal surfaces thereof.

On the 26th base layer BL26, a low-pass filter ground electrode LG (first filter ground electrode), a high-pass filter ground electrode HG, and a shield ground electrode SG are provided. Further, on the base layer BL26, a line electrode L01d is provided. Further, in the base layer BL26, a plurality of via conductors penetrate through both principal surfaces thereof.

On the 27th base layer BL27, a line electrode L01c is provided. Further, on the base layer BL27, eight capacitor electrodes C15a, C16a, C17a, C18a, C26a, C27a, C28a, and C29a are provided. Further, in the base layer BL27, a plurality of via conductors penetrate through both principal surfaces thereof.

On the 28th base layer BL28, a low-pass filter ground electrode LG, a high-pass filter ground electrode HG, and a shield ground electrode SG are provided. Further, on the base layer BL28, a line electrode L01b is provided. Further, in the base layer BL28, a plurality of via conductors penetrate through both principal surfaces thereof.

On the 29th base layer BL29, a line electrode L01a is provided. Further, on the base layer BL29, eight capacitor electrodes C15a, C16a, C17a, C18a, C26a, C27a, C28a, and C29a are provided. Further, in the base layer BL29, a plurality of via conductors penetrate through both principal surfaces thereof.

On the 30th base layer BL30, a low-pass filter ground electrode LG, a high-pass filter ground electrode HG, and a shield ground electrode SG are provided. Further, in the base layer BL30, a plurality of via conductors penetrate through both principal surfaces thereof.

In each of the 31st base layer BL31 and the 32nd base layer BL32, a plurality of via conductors penetrate through both principal surfaces thereof.

As illustrated in FIG. 6, in each of the 33rd base layer BL33 and the 34th base layer BL34, a plurality of relay electrodes are provided. Further, in each of the base layers BL33 and BL34, a plurality of via conductors penetrate through both principal surfaces thereof.

On the upper-side principal surface of the 35th (bottom-most) base layer BL35, a plurality of relay electrodes are provided. Further, on the lower-side principal surface of the base layer BL35, namely, on the lower-side principal surface of the multilayer substrate 1, the first terminal T1, the second terminal T2, the third terminal T3, the two low-pass filter ground terminals LGT1, LGT2, the two high-pass filter ground terminals HGT1, HGT2, the one shield ground terminal SGT, and the four floating terminals FT are provided, as described above.

In each of the electrodes, terminals, and via conductors, copper, silver, aluminum, or other suitable material, or alloy thereof may preferably be used as a primary component. A plating layer may be further provided on the surface of each terminal.

The diplexer 100 according to the first preferred embodiment includes the multilayer substrate 1 in which the 35 base layers BL1 to BL35 are stacked, and ten inductors L11 to L14 and L21 to L26 are mounted on the upper-side principal surface of the multilayer substrate 1, as described above.

The diplexer 100 having the above-described structure has an equivalent circuit illustrated in FIG. 7.

The diplexer 100 includes the first terminal T1, the second terminal T2, and the third terminal T3. Further, the diplexer 100 includes the low-pass filter LPF as the first filter and the high-pass filter HPF as the second filter.

First, a common inductor L01 is connected to the first terminal T1. The low-pass filter LPF is connected between the common inductor L01 and the second terminal T2. The high-pass filter HPF is connected between the common inductor L01 and the third terminal T3.

In the low-pass filter LPF, the inductor L11, the inductor L12, and the capacitor C11 that are connected in parallel, the inductor L13 and the capacitor C12 that are connected in parallel, the inductor L14 and the capacitor C13 that are connected in parallel, and the inductor L15 and the capacitor C14 that are connected in parallel are sequentially connected to a signal line connecting the common inductor L01 and the second terminal T2. Further, the capacitor C15 is connected between the low-pass filter ground electrode LG and a connection point of the inductor L11 and the parallel-connected inductor L12 and capacitor C11. The capacitor C16 is connected between the low-pass filter ground electrode LG and a connection point of the parallel-connected inductor L12 and capacitor C11 and the parallel-connected inductor L13 and capacitor C12. The capacitor C17 is connected between the low-pass filter ground electrode LG and a connection point of the parallel-connected inductor L13 and capacitor C12 and the parallel-connected inductor L14 and capacitor C13. The capacitor C18 is connected between the low-pass filter ground electrode LG and a connection point of the parallel-connected inductor L14 and capacitor C13 and the parallel-connected inductor L15 and capacitor C14. Further, the low-pass filter ground electrode LG is connected to the low-pass filter ground terminals LGT1 and LGT2.

In the high-pass filter HPF, the five capacitors C21 to C25 and the one inductor L21 are sequentially connected to a signal line connecting the common inductor L01 and the third terminal T3. The inductor L22 and the capacitor C26 that are connected in series is connected between the high-pass filter ground electrode HG and a connection point of the capacitor C21 and the capacitor C22. The inductor L23 and the capacitor C27 that are connected in series is connected between the high-pass filter ground electrode HG and a connection point of the capacitor C22 and the capacitor C23. The inductor L24 and the capacitor C28 that are connected in series is connected between the high-pass filter ground electrode HG and a connection point of the capacitor C23 and the capacitor C24. The inductor L25 and the capacitor C29 that are connected in series is connected between the high-pass filter ground electrode HG and a connection point of the capacitor C24 and the capacitor C25. Further, the capacitor C30 and the inductor L26 that are connected in parallel is connected between the high-pass filter ground electrode HG and a connection point of the inductor L21 and the third terminal T3. The high-pass filter ground electrode HG is connected to the high-pass filter ground terminals HGT1 and HGT2.

The shield ground electrode SG is disposed between the low-pass filter LPF and the high-pass filter HPF. Further, the shield ground electrode SG is connected to the shield ground terminal SGT.

Next, relationships between the structure of the diplexer 100 illustrated in FIG. 1 to FIG. 6 and the equivalent circuit of the diplexer 100 illustrated in FIG. 7 are described.

First, the line electrodes L01a to L01d are connected by the via conductors and define the common inductor L01. One end portion of the common inductor L01 is connected to the first terminal T1 by a via conductor. Further, the other end portion of the common inductor L01 is connected to each of the low-pass filter LPF and the high-pass filter HPF by a via conductor and a wiring electrode. More specifically, the other end portion of the common inductor L01 is connected to each of the land electrode EL11a and the capacitor electrode C21a by the via conductor and the wiring electrode. The land electrode EL11a defines a portion of the low-pass filter LPF, and the capacitor electrode C21a defines a portion of the high-pass filter HPF.

First, in the low-pass filter LPF, the inductor L11 (an electronic component) is mounted between the land electrode EL11a and the land electrode EL11b illustrated in FIG. 2. Further, the land electrode EL11b is connected to the land electrode EL12a and the capacitor electrode C11a by a via conductor and a wiring electrode.

Next, the inductor L12 is mounted between the land electrode EL12a and the land electrode EL12b. The capacitor electrode C11a and the capacitor electrode C11b define the capacitor C11. Further, the land electrode EL12b and the capacitor electrode C11b are connected to the land electrode EL13a and the capacitor electrode C12a by a via conductor and a wiring electrode.

Next, the inductor L13 is mounted between the land electrode EL13a and the land electrode EL13b. The capacitor electrode C12a and the capacitor electrode C12b define the capacitor C12. Further, the land electrode EL13b and the capacitor electrode C12b are connected to the land electrode EL14a and the capacitor electrode C13a by a via conductor and a wiring electrode.

Next, the inductor L14 is mounted between the land electrode EL14a and the land electrode EL14b. The capacitor electrode C13a and the capacitor electrode C13b define the capacitor C13. Further, the land electrode EL14b and the capacitor electrode C13b are connected to one end portion of the line electrode L15a and the capacitor electrode C14a by a via conductor and a wiring electrode.

The line electrode L15a illustrated in FIG. 2 defines the inductor L15. The capacitor electrode C14a and the capacitor electrode C14b define the capacitor C14. Further, the other end portion of the line electrode L15a and the capacitor electrode C14b are connected to the second terminal T2 by a via conductor and a wiring electrode.

The land electrode EL11b, the land electrode EL12a, and the capacitor electrode C11a are connected to the capacitor electrode C15a by a via conductor and a wiring electrode. Further, the capacitor electrode C15a and the low-pass filter ground electrode LG define the capacitor C15.

The land electrode EL12b, the land electrode EL13a, the capacitor electrode C11b, and the capacitor electrode C12a are connected to the capacitor electrode C16a by via conductors and wiring electrodes. Further, the capacitor electrode C16a and the low-pass filter ground electrode LG define the capacitor C16.

The land electrode EL13b, the land electrode EL14a, the capacitor electrode C12b, and the capacitor electrode C13a are connected to the capacitor electrode C17a by a via conductor and a wiring electrode. Further, the capacitor electrode C17a and the low-pass filter ground electrode LG define the capacitor C17.

The land electrode EL14b, one end portion of the line electrode L15a, the capacitor electrode C13b, and the capacitor electrode C14a are connected to the capacitor electrode C18a by a via conductor and a wiring electrode. Further, the capacitor electrode C18a and the low-pass filter ground electrode LG define the capacitor C18.

Further, the low-pass filter ground electrode LG is connected to the low-pass filter ground terminals LGT1 and LGT2 by a via conductor and a relay electrode.

On the other hands, in the high-pass filter HPF, the capacitor electrode C21a connected to the other end portion of the common inductor L01 and the capacitor electrode C21b define the capacitor C21. Further, the capacitor electrode C21b is connected to the capacitor electrode C22a by a via conductor and a wiring electrode.

Next, the capacitor electrode C22a and the capacitor electrode C22b define the capacitor C22. Further, the capacitor electrode C22b is connected to the capacitor electrode C23a.

Next, the capacitor electrode C23a and the capacitor electrode C23b define the capacitor C23. Further, the capacitor electrode C23b is connected to the capacitor electrode C24a by a via conductor and a wiring electrode.

Next, the capacitor electrode C24a and the capacitor electrode C24b define the capacitor C24. Further, the capacitor electrode C24b is connected to the capacitor electrode C25a by a via conductor and a wiring electrode.

Next, the capacitor electrode C25a and the capacitor electrode C25b define the capacitor C25. Further, the capacitor electrode C25b is connected to the land electrode EL21a by a via conductor and a wiring electrode.

Next, the inductor L21 is mounted between the land electrode EL21a and the land electrode EL21b. Further, the land electrode EL21b is connected to the third terminal T3 by a via conductor, a wiring electrode, and a relay electrode.

The capacitor electrode C21b and the capacitor electrode C22a are connected to the land electrode EL22a by a via conductor and a wiring electrode. Further, the inductor L22 is mounted between the land electrode EL22a and the land electrode EL22b. Further, the land electrode EL22b is connected to the capacitor electrode C26a by a via conductor and a wiring electrode. Further, the capacitor electrode C26a and the high-pass filter ground electrode HG define the capacitor C26.

The capacitor electrode C22b and the capacitor electrode C23a are connected to the land electrode EL23a by a via conductor and a wiring electrode. Further, the inductor L23 is mounted between the land electrode EL23a and the land electrode EL23b. Further, the land electrode EL23b is connected to the capacitor electrode C27a by a via conductor and a wiring electrode. Further, the capacitor electrode C27a and the high-pass filter ground electrode HG define the capacitor C27.

The capacitor electrode C23b and the capacitor electrode C24a are connected to the land electrode EL24a by a via conductor and a wiring electrode. Further, the inductor L24 is mounted between the land electrode EL24a and the land electrode EL24b. Further, the land electrode EL24b is connected to the capacitor electrode C28a by a via conductor and a wiring electrode. Further, the capacitor electrode C28a and the high-pass filter ground electrode HG define the capacitor C28.

The capacitor electrode C24b and the capacitor electrode C25a are connected to the land electrode EL25a by a via conductor and a wiring electrode. Further, the inductor L25 is mounted between the land electrode EL25a and the land electrode EL25b. Further, the land electrode EL25b is connected to the capacitor electrode C29a by a via conductor and a wiring electrode. Further, the capacitor electrode C29a and the high-pass filter ground electrode HG define the capacitor C29.

The land electrode EL21b and the third terminal T3 are connected to the capacitor electrode C30a and the land electrode EL26a by a via conductor and a wiring electrode. The capacitor electrode C30a and the capacitor electrode C30b define the capacitor C30. The inductor L26 is mounted between the land electrode EL26a and the land electrode EL26b. Further, the capacitor electrode C30b and the land electrode EL26b are connected to the high-pass filter ground electrode HG by a via conductor and a wiring electrode.

Further, the high-pass filter ground electrode HG is connected to the high-pass filter ground terminals HGT1 and HGT2 by a via conductor and a relay electrode.

A plurality of the shield ground electrodes SG are connected to each other by a plurality of the via conductors. Further, the shield ground electrode SG provided on the base layer BL30, which is located on the lowest side, is connected to the shield ground terminal SGT by a plurality of the via conductors and a plurality of the relay electrodes.

The diplexer 100 according to the present preferred embodiment may be fabricated using a diplexer fabrication method that is typically performed in the related art.

The diplexer 100 according to the present preferred embodiment preferably has the following characteristic features.

In the diplexer 100, the low-pass filter ground electrode LG, the high-pass filter ground electrode HG, and the shield ground electrode SG are separately provided inside the multilayer substrate 1. Further, the low-pass filter ground terminals LGT1 and LGT2, the high-pass filter ground terminals HGT1 and HGT2, and the shield ground Terminal SGT are separately provided on the surface of the multilayer substrate 1. Further, the connection between the low-pass filter ground electrode LG and the low-pass filter ground terminals LGT1 and LGT2, the connection between the high-pass filter ground electrode HG and the high-pass filter ground terminals HGT1 and HGT2, and the connection between the shield ground electrode SG and the shield ground terminal SGT are separately provided. Accordingly, the diplexer 100 ensures the isolation of the low-pass filter LPF (first filter) and the high-pass filter HPF (second filter) from each other and has excellent frequency characteristics.

Further, in the diplexer 100, a stray capacitance and an inductance component between the low-pass filter ground electrode LG and the low-pass filter ground terminals LGT1 and LGT2 and a stray capacitance and an inductance component between the high-pass filter ground electrode HG and the high-pass filter ground terminals HGT1 and HGT2 are independently adjustable from each other. Accordingly, the diplexer 100 enables optimization of the frequency characteristics of the low-pass filter LPF (first filter) without being influenced by the other filter. Further, the diplexer 100 enables improvement or optimization of the frequency characteristics of the high-pass filter HPF (second filter) without being influenced by the other filter.

Further, in the diplexer 100, the common inductor L01 includes the line electrodes L01a to L01d between the first terminal T1 and the low-pass filter LPF and between the first terminal T1 and the high-pass filter HPF. This further improves the frequency characteristics of the low-pass filter LPF (first filter) and the frequency characteristics of the high-pass filter HPF (second filter).

Further, as illustrated in FIG. 7, in the diplexer 100, the shield ground electrode SG shields the latter portion of the low-pass filter LPF towards the second terminal T2, namely, a portion of the low-pass filter LPF including the inductor L13 and beyond, from the latter portion of the high-pass filter HPF towards the third terminal T3, namely, a portion of the high-pass filter HPF including the inductor L24 and beyond. In other words, the latter portion having a larger degrading influence, when coupled, on the frequency characteristics is shielded. Thus, the degradation of the frequency characteristics is effectively reduced or prevented. At the same time, in the diplexer 100, the distance between the common inductor L01 and the shield ground electrode SG is increased within the multilayer substrate 1. Thus, the degradation of the frequency characteristics due to unwanted coupling between the common inductor L01 and the shield ground electrode SG is also reduced or prevented.

In the diplexer 100, the shield ground electrode SG is disposed between the low-pass filter ground electrode LG and the high-pass filter ground electrode HG within the multilayer substrate 1. Thus, the isolation of the low-pass filter LPF (first filter) and the high-pass filter HPF (second filter) from each other is ensured.

In the diplexer 100, as illustrated in FIG. 4 and FIG. 5, when an outer edge portion of the low-pass filter ground electrode (first filter ground electrode) LG and an outer edge portion of the high-pass filter ground electrode (second filter ground electrode) HG are compared, the outer edge portion of the high-pass filter ground electrode HG includes a larger number of indentations and indentations that are larger in size than the outer edge portion of the low-pass filter ground electrode LG. Further, in the 30th base layer BL30 of FIG. 5, while the low-pass filter ground electrode LG and the low-pass filter ground terminals LGT1 and LGT2 are each connected by a single via conductor as denoted by two dotted line circles X-1, the high-pass filter ground electrode HG and the high-pass filter ground terminals HGT1 and HGT2 are each connected by two via conductors as denoted by two dotted line circles X-2. As a result, in the diplexer 100, an inductance component between the low-pass filter ground electrode LG and the low-pass filter ground terminal LGT1, LGT2 via the via conductor becomes relatively larger, and an inductance component between the high-pass filter ground electrode HG and the high-pass filter ground terminal HGT1, HGT2 via the via conductor becomes relatively smaller. Accordingly, in the diplexer 100, the frequency characteristics of the low-pass filter LPF (first filter) is improved, and the frequency characteristics of the high-pass filter HPF (second filter) is improved.

In the diplexer 100, the low-pass filter ground electrode LG and the shield ground electrode SG are electromagnetically coupled, and the high-pass filter ground electrode HG and the shield ground electrode SG are electromagnetically coupled. As a result, in the diplexer 100, the electromagnetic coupling between the low-pass filter ground electrode LG and the high-pass filter ground electrode HG is reduced or prevented, thus further ensuring the isolation of the low-pass filter LPF (first filter) and the high-pass filter HPF (second filter) from each other.

In the diplexer 100, the shield ground electrode SG is provided in a plurality of interlayer spacings of the multilayer substrate 1, and the shield ground electrodes SG stacked in different interlayer spacings are connected to each other by via conductors. As a result, since the shield ground electrodes SG and the via conductors provide the shielding in the diplexer 100, the isolation of the low-pass filter LPF (first filter) and the high-pass filter HPF (second filter) from each other is further improved.

In the diplexer 100, as illustrated in the base layers BL26 to BL30 of FIG. 5, for example, the base layers BL26, BL28, and BL30 in which the shield ground electrode SG is provided and the base layers BL27 and BL29 in which the shield ground electrode SG is not provided are stacked in alternating fashion. In other words, the shield ground electrode SG is provided on the base layers BL26, BL28, and BL30 in which the low-pass filter ground electrode LG and the high-pass filter ground electrode HG are provided whereas the shield ground electrode SG is not provided on the base layers BL27 and BL29 in which the capacitor electrodes C15a to C18a and C26a to C29a are provided. This is to prevent degradation of frequency characteristics due to the generation of unwanted stray capacitance between the shield ground electrode SG and the capacitor electrodes C15a to C18a and C26a to C29a. In the diplexer 100, the degradation of the frequency characteristics is reduced or prevented by providing the shield ground electrode SG on every other layer.

In order to confirm the excellent quality on the frequency characteristics of the diplexer 100 according to the present preferred embodiment, a diplexer (not illustrated) according to a comparative example was produced. In the diplexer according to the comparative example, on the 30th base layer BL30, the low-pass filter ground electrode LG, the high-pass filter ground electrode HG, and the shield ground electrode SG are combined to provide a single common ground electrode. Further, this common ground electrode is connected to five common ground terminals provided on the lower-side principal surface of the multilayer substrate 1 (base layer BL35). Here, the five common ground terminals are provided on the same locations as the low-pass filter ground terminals LGT1 and LGT2, the high-pass filter ground terminals HGT1 and HGT2, and the shield ground electrode SG of the diplexer 100.

Figure 8A:
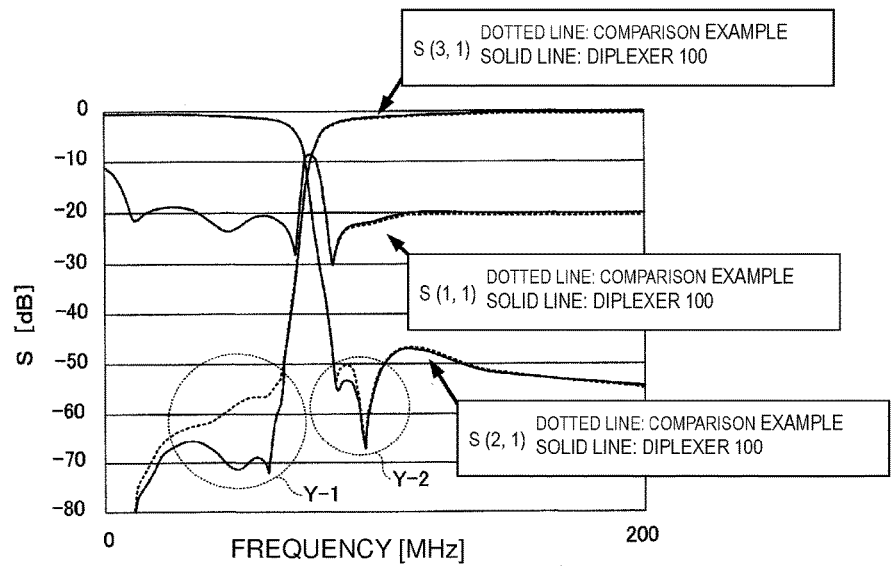
FIGS. 8A and 8B are graphs each illustrating frequency characteristics of the diplexer 100 and a diplexer according to a comparison example.
Figure 8B:
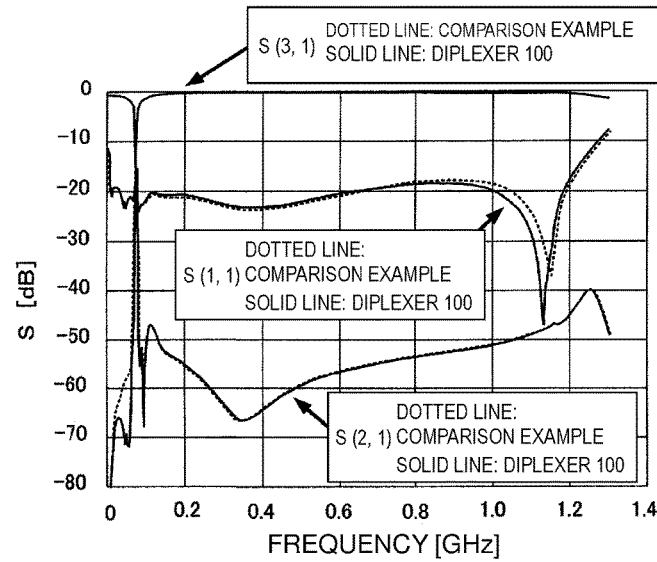

In FIGS. 8A and 8B, solid lines represent frequency characteristics of the diplexer 100 according to the first preferred embodiment, and dotted lines represent frequency characteristics of the diplexer according to the comparative example. FIG. 8A is an enlarged view of a portion of FIG. 8B.

Compared to the diplexer according to the comparative example, the attenuation near the passband of the high-pass filter HPF is substantially improved in the diplexer 100 according to the first preferred embodiment, as illustrated by a dotted line circle Y-1. Further, the attenuation near the passband of the low-pass filter LPF is also substantially improved, as illustrated by a dotted line circle Y-2. In this manner, the diplexer 100 has excellent frequency characteristics.

Second Preferred Embodiment

Figure 9:
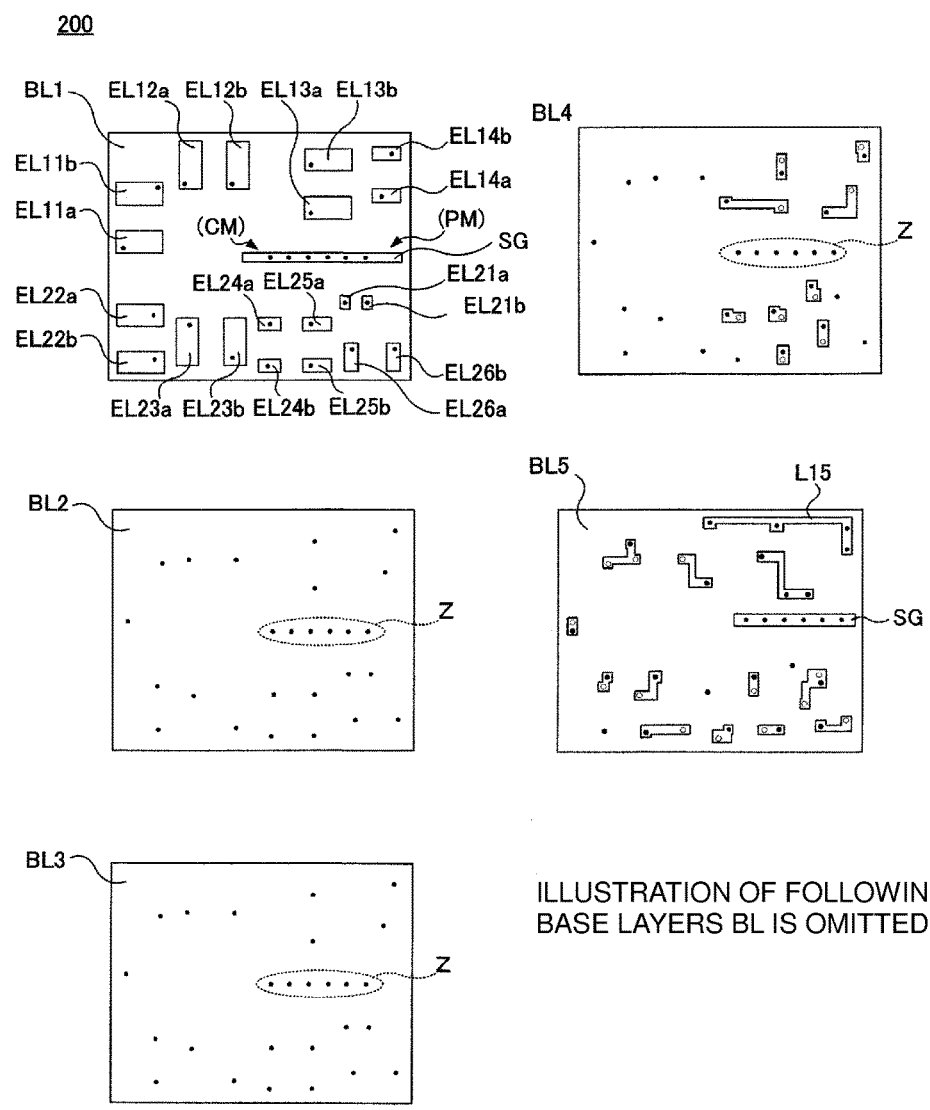
FIG. 9 shows plan views of respective upper-side principal surfaces of base layers BL1 to BL5 stacked on a multilayer substrate 1 of a diplexer 200 according to a second preferred embodiment of the present invention.

FIG. 9 depicts a diplexer 200 according to the second preferred embodiment of the present invention. FIG. 9 illustrates upper-side principal surfaces of a first base layer BL1 to a fifth base layer BL5 of a multilayer substrate 1 of the diplexer 200.

In the diplexer 100 according to the first preferred embodiment illustrated in FIG. 1A to FIG. 7, no shield ground electrode SG is provided on the upper-side principal surface of the multilayer substrate 1 (base layer BL1), but the chuck mark CM and the pin mark PM are provided.

In the diplexer 200, as illustrated in FIG. 9, a shield ground electrode SG that also defines and functions as a chuck mark CM and a pin mark PM is provided on the upper-side principal surface of the base layer BL1. Further, the shield ground electrode SG provided on the base layer BL1 is connected to the shield ground electrode SG provided on the base layer BL5 by providing a plurality of via conductors in a region enclosed by a dotted line ellipse Z at each of the base layers BL1 to BL4. The remaining configuration of the diplexer 200 is the same or substantially the same as that of the diplexer 100.

In the case in which the chuck mark CM and the pin mark PM are each a floating electrode as is the case with the diplexer 100, it is difficult to obtain an electrical potential necessary for electrolytic plating, and it is difficult to form a protective layer on a surface by electrolytic plating. On the other hand, in the diplexer 200, the chuck mark CM and the pin mark PM define and function as the shield ground electrode SG, thus facilitating the formation of a protective layer on a surface by electrolytic plating.

Third Preferred Embodiment

Figure 10:
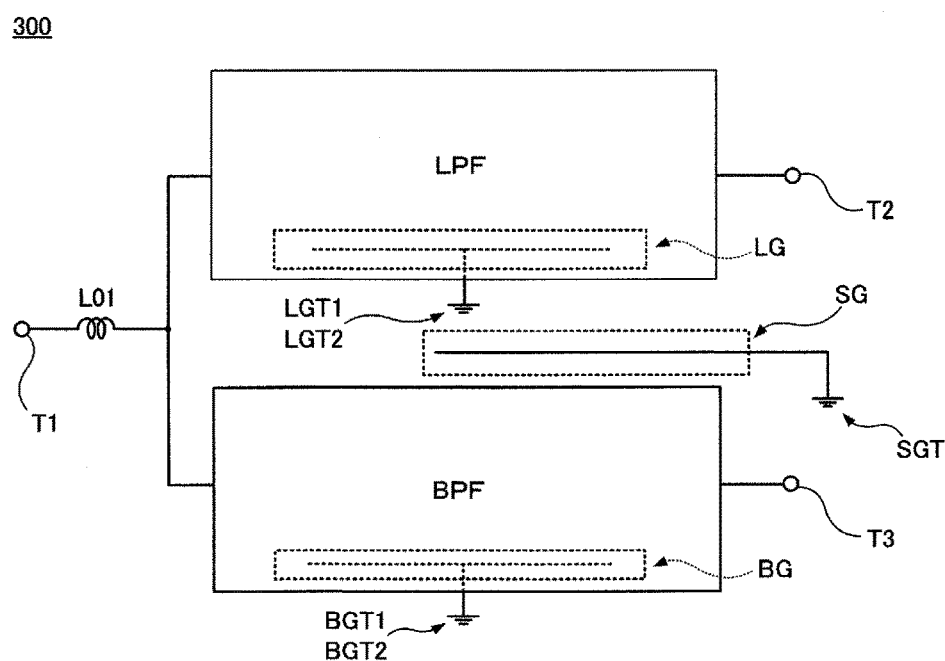
FIG. 10 is an illustrative view (simplified equivalent circuit diagram) of a diplexer 300 according to a third preferred embodiment of the present invention.
Figure 11A:
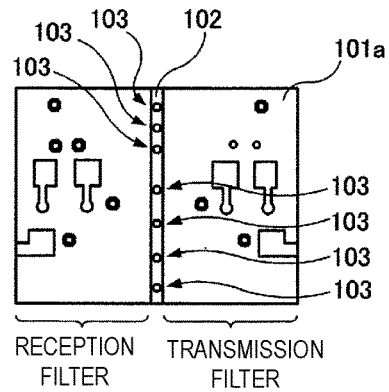
FIG. 11A is a plan view of a base layer 101a stacked in a multilayer substrate of a diplexer 1100 disclosed in Japanese Unexamined Patent Application Publication No. 2014-179967 and being a seventh stacked layer from a top.
Figure 11B:
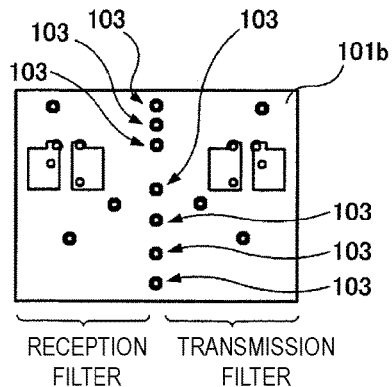
FIG. 11B is a plan view of an eighth base layer 101b from the top.
Figure 11C:
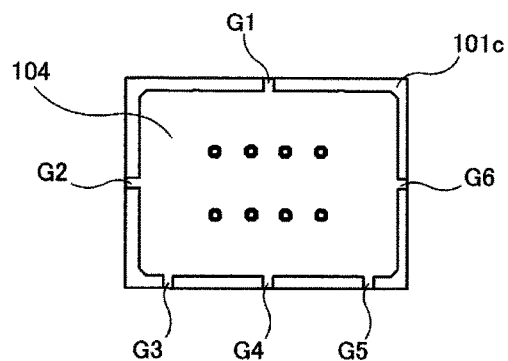
FIG. 11C is a plan view of eighteenth base layer 101c from the top.
Figure 12:
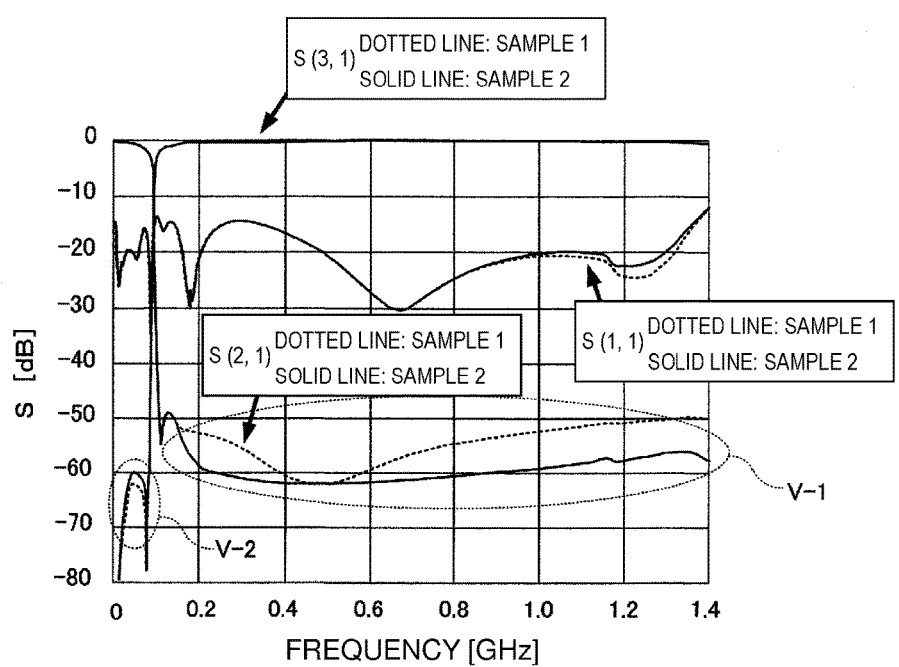
FIG. 12 is a graph illustrating frequency characteristics of sample 1 and sample 2 in an experiment conducted to study influence of length between a common ground electrode and each ground terminal (size of inductance component) to frequency characteristics.

FIG. 10 depicts a diplexer 300 according to the third preferred embodiment of the present invention. FIG. 10 is an illustrative view (simplified equivalent circuit diagram) of the diplexer 300.

The diplexer 100 according to the first preferred embodiment illustrated in FIG. 1 to FIG. 7 includes the low-pass filter LPF as the first filter and the high-pass filter HPF as the second filter.

On the other hand, the diplexer 300 includes a bandpass filter BPF as the second filter, instead of the high-pass filter HPF. In other words, the diplexer 300 includes the low-pass filter LPF and the bandpass filter BPF. Further, in the diplexer 300, a bandpass filter ground electrode BG is connected to bandpass filter ground terminals BGT1 and BGT2 by a via conductor. The remaining configuration of the diplexer 300 is the same or substantially the same as that of the diplexer 100.

In the diplexer 300, a shield ground electrode SG provides the isolation of the low-pass filter LPF (first filter) and the bandpass filter BPF (second filter) from each other. Thus, the diplexer 300 has excellent frequency characteristics.

Thus far, the diplexers 100 to 300 according to the first preferred embodiment to the third preferred embodiment are described. However, it is to be understood that diplexers of the present invention are not limited to the foregoing preferred embodiments, and that various modifications may be made within the scope of the present invention.

For example, in the foregoing preferred embodiments, the inductors L11 to L14 and L21 to L25 preferably are mounted on a non-mounting surface (upper-side principal surface) of the multilayer substrate 1. In addition to the above, the capacitors that have been defined by capacitor electrodes within the multilayer substrate 1 may be mounted as capacitor elements on the non-mounting surface of the multilayer substrate 1. Alternatively, some of the inductors L11 to L14 and L21 to L25 that have been mounted on the non-mounting surface of the multilayer substrate 1 may be inductors defined by line electrodes within the multilayer substrate 1.

The equivalent circuit of the diplexer is arbitrary and not limited to the foregoing preferred embodiments.

The number of layers of the base layers BL1 to BL35 included in the multilayer substrate 1 and the shapes or the number of electrodes and the locations or the number of the via conductors provided on each of the base layers BL1 to BL35 are arbitrary and not limited to the foregoing preferred embodiments.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A diplexer comprising:
a multilayer substrate including a mounting surface and a non-mounting surface, and a plurality of base layers that are stacked; and
a first terminal, a second terminal, a third terminal, and a ground terminal provided on the mounting surface of the multilayer substrate; wherein
a first filter is provided between the first terminal and the second terminal, and a second filter is provided between the first terminal and the third terminal;
the multilayer substrate includes, in an interlayer spacing of the multilayer substrate, a first filter ground electrode, a second filter ground electrode, and a shield ground electrode that provides shielding between the first filter and the second filter, wherein the first filter ground electrode, the second filter ground electrode, and the shield ground electrode are independent from each other;
the ground terminal includes a first filter ground terminal connected to the first filter ground electrode, a second filter ground terminal connected to the second filter ground electrode, and a shield ground terminal connected to the shield ground electrode, wherein the first filter ground terminal, the second filter ground terminal, and the shield ground terminal are independent from each other; and
a portion of each of the first filter and the second filter is mounted on the multilayer substrate, and another portion of each of the first filter and the second filter is provided inside of the multilayer substrate.

2. The diplexer according to claim 1, wherein the first filter includes a low-pass filter, and the second filter includes a high-pass filter or a bandpass filter.

3. The diplexer according to claim 1, wherein the first terminal is connected to each of the first filter and the second filter with a common inductor interposed therebetween, the common inductor being defined by a line electrode stacked in an interlayer spacing of the multilayer substrate.

4. The diplexer according to claim 3, wherein the first filter includes a low-pass filter, and the second filter includes a bandpass filter or a high-pass filter.

5. The diplexer according to claim 1, wherein the shield ground electrode provides shielding at least between an inductor on a second terminal side and an inductor on a third terminal side, the inductor on the second terminal side being one of a plurality of first inductors included in the first filter and being disposed on a side of the second terminal among inductors of the plurality of first inductors disposed between the first terminal and the second terminal, the inductor on a third terminal side being one of a plurality of second inductors included in the second filter and being disposed on a side of the third terminal among inductors of the plurality of second inductors disposed between the first terminal and the third terminal.

6. The diplexer according to claim 1, wherein the shield ground electrode is provided between the first filter ground electrode and the second filter ground electrode within the multilayer substrate.

7. The diplexer according to claim 1, wherein
the first filter ground electrode and the first filter ground terminal are connected by a first via conductor, and the second filter ground electrode and the second filter ground terminal are connected by a second via conductor; and
an inductance component between the first filter ground electrode and the first filter ground terminal is larger than an inductance component between the second filter ground electrode and the second filter ground terminal.

8. The diplexer according to claim 7, wherein
an outer edge portion of the second filter ground electrode has a larger number of indentations and/or an indentation larger in size than an outer edge portion of the first filter ground electrode; and
a number of the via conductors connecting the first filter ground electrode and the first filter ground terminal is less than a number of the via conductors connecting the second filter ground electrode and the second filter ground terminal.

9. The diplexer according to claim 1, wherein the first filter ground electrode and the shield ground electrode are electromagnetically coupled, and the second filter ground electrode and the shield ground electrode are electromagnetically coupled.

10. The diplexer according to claim 1, wherein the shield ground electrode includes a plurality of shield ground electrodes stacked in a plurality of interlayer spacings of the multilayer substrate and connected to each other by a via conductor.

11. The diplexer according to claim 1, wherein
the shield ground electrode is disposed on the non-mounting surface of the multilayer substrate; and
the shield ground electrode disposed on the non-mounting surface of the multilayer substrate is connected to the shield ground electrode stacked in an interlayer spacing of the multilayer substrate by a via conductor.

12. The diplexer according to claim 1, wherein
the first filter ground electrode includes a plurality of first filter ground electrodes stacked in a plurality of interlayer spacings of the multilayer substrate and are connected to each other by a via conductor;
the second filter ground electrode includes a plurality of second filter ground electrodes stacked in a plurality of interlayer spacings of the multilayer substrate and connected to each other by a via conductor;
the shield ground electrode includes a plurality of shield ground electrodes stacked in a plurality of interlayer spacings of the multilayer substrate and connected to each other by a via conductor; and
in a stacking direction of the multilayer substrate, an interlayer spacing where the multilayer substrate in which the first filter ground electrode, the second filter ground electrode, and the shield ground electrode are stacked such that the shield ground electrode is interposed between the first filter ground electrode and the second filter ground electrode, and an interlayer spacing where the multilayer substrate in which the first filter ground electrode, the second filter ground electrode, and the shield ground electrode are not stacked, are repeatedly provided a plurality of times in an alternating fashion.

13. The diplexer according to claim 1, wherein the multilayer substrate is made of a low temperature co-fired ceramic.

14. The diplexer according to claim 1, wherein a chuck mark that defines and functions as a guide mark during vacuum suction of the diplexer is provided on the non-mounting surface.

15. The diplexer according to claim 1, wherein pin marks indicating locations of the first, second, third, and ground terminals are provided on the non-mounting surface.

16. The diplexer according to claim 1, wherein the shield ground electrode is provided on the non-mounting surface.

17. The diplexer according to claim 16, wherein the shield ground electrode defines and functions as a guide mark during vacuum suction of the diplexer is provided on the non-mounting surface and defines and functions as pin marks indicating locations of the first, second, third, and ground terminals.

* * * * *